US012745439B2

(12) United States Patent
Lanzillo et al.

(10) Patent No.: US 12,745,439 B2
(45) Date of Patent: Sep. 22, 2026

(54) FRONTSIDE-TO-BACKSIDE CONNECTION WITH CUT FOR STACKED TRANSISTOR

(71) Applicant: International Business Machines Corporation, Armonk, NY (US)

(72) Inventors: Nicholas Anthony Lanzillo, Wynantskill, NY (US); Koichi Motoyama, Clifton Park, NY (US); Ruilong Xie, Niskayuna, NY (US); James P Mazza, Saratoga Springs, NY (US)

(73) Assignee: International Business Machines Corporation, Armonk, NY (US)

(*) Notice: Subject to any disclaimer, the term of this patent is extended or adjusted under 35 U.S.C. 154(b) by 375 days.

(21) Appl. No.: 18/539,385

(22) Filed: Dec. 14, 2023

(65) Prior Publication Data

US 2025/0203974 A1 Jun. 19, 2025

(51) Int. Cl.

| | |
|---|---|
| ***H10D 62/13*** | (2025.01) |
| ***H10D 84/01*** | (2026.01) |
| ***H10D 84/03*** | (2025.01) |
| ***H10D 84/83*** | (2025.01) |
| ***H10W 20/00*** | (2026.01) |
| ***H10W 20/43*** | (2026.01) |

(52) U.S. Cl.

CPC ......... *H10D 62/151* (2025.01); *H10D 84/013* (2025.01); *H10D 84/0149* (2025.01); *H10D 84/038* (2025.01); *H10D 84/83* (2025.01); *H10W 20/089* (2026.01); *H10W 20/43* (2026.01)

(58) Field of Classification Search

CPC ............................ H10D 88/101; H10W 20/43
See application file for complete search history.

(56) References Cited

U.S. PATENT DOCUMENTS

| | | | |
|---|---|---|---|
| 9,911,736 | B1 | 3/2018 | Zang |
| 11,133,217 | B1 | 9/2021 | Reznicek |
| 11,437,283 | B2 | 9/2022 | Lilak |
| 11,581,410 | B2 | 2/2023 | Yeong |
| 2022/0037528 | A1 | 2/2022 | Chuang |
| 2022/0231013 | A1 | 7/2022 | Hong |

(Continued)

OTHER PUBLICATIONS

Motoyama, et al., "Stacked FET Contact Formation", Application No. IB2023/058527, Filed Date: Aug. 29, 2023, 40 Pages. (Spec + Drawing).

(Continued)

*Primary Examiner* — Shih Tsun A Chou
(74) *Attorney, Agent, or Firm* — Gavin Giraud

(57) ABSTRACT

Embodiments disclosed herein include a semiconductor structure. The semiconductor structure may include a device layer having a first top source/drain (S/D), a second top S/D, a first bottom S/D, and a second bottom S/D. The semiconductor structure may further include a first direct back side contact connected to the first bottom S/D, a second direct back side contact connected to the second bottom S/D, and a double via. The double via may include a first half connecting a front side of the device layer to the first direct back side contact, and a second half connecting the front side to the second direct back side contact. The double via may also include a dividing cut splitting the first half of the double via from the second half of the double via.

20 Claims, 4 Drawing Sheets

(56) References Cited

U.S. PATENT DOCUMENTS

| | | | | |
|---|---|---|---|---|
| 2022/0416057 | A1 | 12/2022 | Bouche | |
| 2023/0036522 | A1 | 2/2023 | Chen | |
| 2024/0321886 | A1* | 9/2024 | Cho | H10D 84/85 |

OTHER PUBLICATIONS

Motoyama, et. al., “Stacked FET Contact Formation” U.S. Appl. No. 17/951,739, filed Sep. 23, 2022, pp. 40 (Spec + Drawing).

Xie, et al., “STACKED FETs With Backside Angle Cut”, U.S. Appl. No. 18/332,388, filed Jun. 9, 2023, pp. 69 (Spec + Drawing).

* cited by examiner 100
108
126
114
130
124
122
112
128a
116a
120
116b
128b 100
106
104
102
116a
116b
A'
A 200
224
222
212a
214
212b 200
224
222
212a
216a
220
216b
228a
228b
212b
226
232

200
224
222
212a
212b 200
224
222
212a
214
228
212b

FRONTSIDE-TO-BACKSIDE CONNECTION WITH CUT FOR STACKED TRANSISTOR

BACKGROUND

The present invention relates generally to the field of semiconductor device fabrication, and more particularly to fabricating a cut for stacked transistors that divides a via into halves to insulate contact to two source/drains.

Bottom source/drains in stacked field-effect transistors (FETs) are the terminals of the lower transistors in a vertical stack of devices. They are usually buried under the top transistors and the interlayer dielectric, making them difficult to access from the front side. To connect them to the back end of line (BEOL) wiring, which is the metal interconnect layer on top of the devices, several techniques have been proposed and demonstrated. One of them is to use through-silicon vias (TSVs), which are vertical holes filled with metal that go through the substrate and connect the bottom source/drains to the BEOL. Another technique is to use contact etch stop layer (CESL) engineering, which involves selectively removing the CESL on top of the bottom source/drains and then forming silicide contacts that extend to the BEOL. A third technique is to use epitaxial lateral overgrowth (ELO), which involves growing silicon over the bottom source/drains and then forming contacts on the ELO regions that connect to the BEOL. These techniques can become even more challenging as the cell height (or space/area between devices) becomes smaller.

SUMMARY

Aspects of an embodiment of the present invention include a semiconductor structure that may include a device layer having a first top source/drain (S/D), a second top S/D, a first bottom S/D, and a second bottom S/D. The semiconductor structure may further include a first direct back side contact connected to the first bottom S/D, a second direct back side contact connected to the second bottom S/D, and a double via. The double via may include a first half connecting a front side of the device layer to the first direct back side contact, and a second half connecting the front side to the second direct back side contact. The double via may also include a dividing cut splitting the first half of the double via from the second half of the double via.

Aspects of an embodiment of the present invention encompass a method of fabricating a semiconductor structure. The method may include forming a first top source/drain (S/D), a second top S/D, a first bottom S/D, and a second bottom S/D in a stacked transistor architecture. The method may further include forming a double via between the first top S/D and the second top S/D, and between the first bottom S/D and the second bottom S/D, and forming a dividing cut to split the double via into i) a first half electrically connected between the first bottom S/D and a front side of the semiconductor structure and ii) a second half electrically connected between the second bottom S/D and the front side.

Aspects of an embodiment of the present invention include a semiconductor structure. The semiconductor structure may include a with a double via. The double via may include a first half electrically connected between a front side of a device layer and a first bottom source/drain (S/D) in a stacked transistor architecture and a second half electrically connected between the front side and a second bottom S/D in the stacked transistor architecture. The first half of the double via may be split from the second half of the double via by a dividing cut.

DETAILED DESCRIPTION

Figures 1, 2:
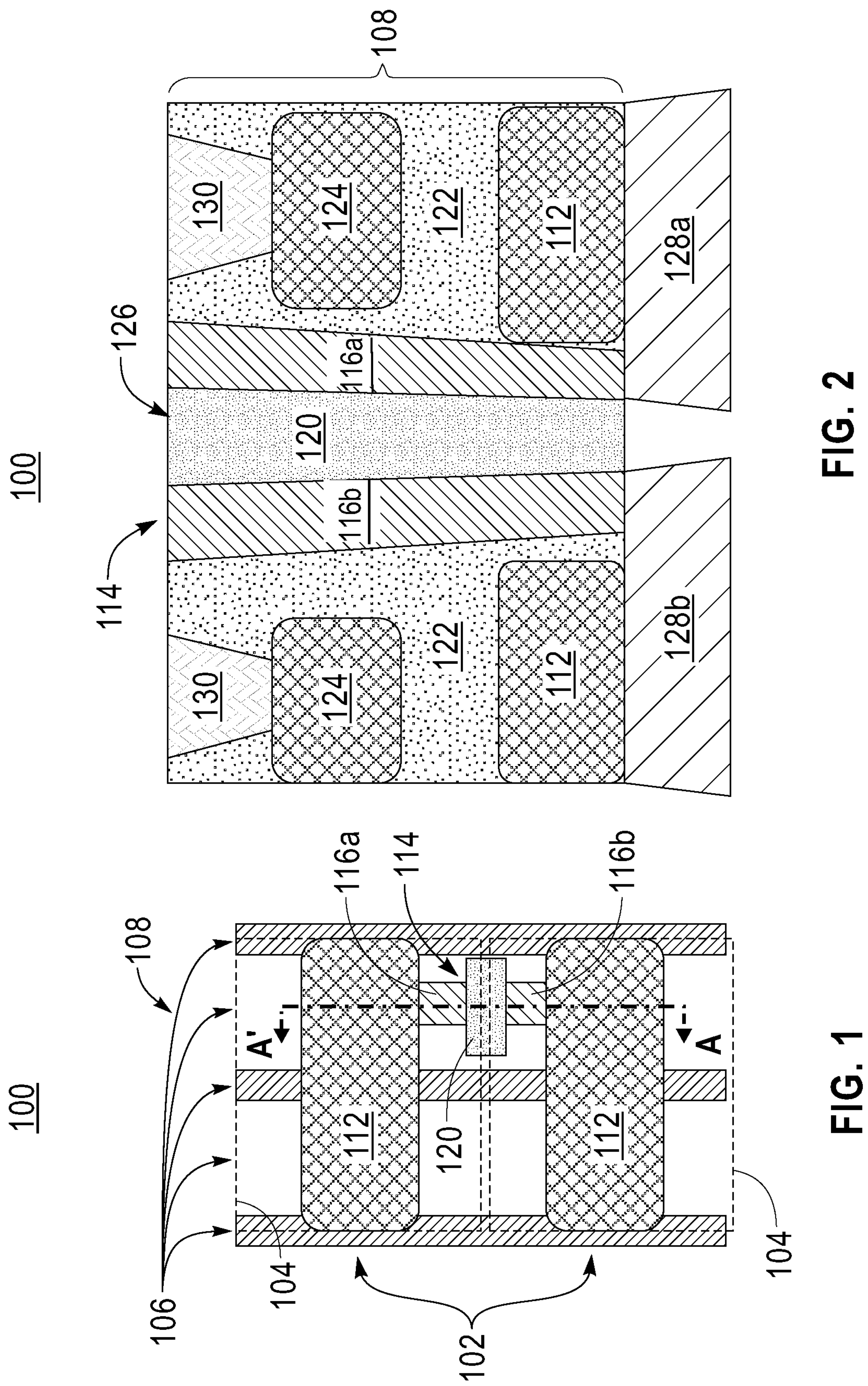
FIG. 1 depicts a cross-sectional top view of a semiconductor structure, in accordance with one embodiment of the present invention.
FIG. 2 depicts a cross-sectional side view of the semiconductor structure of FIG. 1 along line A-A', in accordance with one embodiment of the present invention.

In the following detailed description, reference is made to the accompanying drawings, which show specific examples of embodiments of the invention. These embodiments are described in sufficient detail to enable those skilled in the art to practice them, and it is to be understood that other embodiments may be utilized, and that structural, logical, and electrical changes may be made without departing from the described embodiments. The following detailed description is, therefore, not to be taken in a limiting sense, and the included embodiments are defined by the appended claims.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

References in the specification to "one embodiment," "an embodiment," "certain embodiments," etc., indicate that the embodiment described may include a particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "right," "left," "vertical," "horizontal," "top," "bottom," and derivatives thereof shall relate to the disclosed structures and methods, as oriented in the drawing Figures. The terms "above," "below," "positioned on," or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

It will be understood that when an element as a layer, region or substrate is referred to as being "on" or "over" another element, it can be directly on the other element or intervening elements may also be present. In contrast, when an element is referred to as being "directly adjacent," "directly on," or "directly over" another element, there are no intervening elements present. It will also be understood that when an element is referred to as being "beneath" or "under" another element, it can be directly below or under the other element, or intervening elements may be present. Additionally, when an element is referred to as being "directly below" or "directly above" another element, intervening elements may be present, but the elements overlap at least partially relative to a vertical axis perpendicular to a major surface. With regard to the fabrication of transistors and integrated circuits, major surface refers to that surface of the semiconductor layer in and about which a plurality of transistors are fabricated, e.g., in a planar process. As used herein, the term "vertical" means substantially orthogonal with respect to the major surface and "horizontal" means substantially parallel to the major surface. Typically, the major surface is along a plane of a monocrystalline silicon layer on which transistor devices are fabricated. Each reference number may refer to an item individually or collectively as a group. For example, a contact 202 may refer to a single contact 202 or multiple contacts 202.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. In some embodiments, epitaxial growth and/or deposition processes can be selective to forming on semiconductor surfaces and may or may not deposit material on other exposed surfaces, such as silicon dioxide or silicon nitride surfaces.

Example embodiments are described herein with reference to cross-sectional illustrations that are schematic illustrations of idealized or simplified embodiments (and intermediate structures). As such, variations from the shapes of the illustrations as a result, for example, of manufacturing techniques and/or tolerances, may be expected. Thus, the regions illustrated in the figures are schematic in nature and their shapes do not necessarily illustrate the actual shape of a region of a device and do not limit the scope.

It is to be understood that other embodiments may be used, and structural or logical changes may be made, without departing from the spirit and scope defined by the claims. The description of the embodiments is not limiting. In particular, elements of the embodiments described hereinafter may be combined with elements of different embodiments.

In some embodiments, etching mask layer(s) may be provided, and the layers that are not protected thereby are removed. For example, as is understood in the art, a mask layer, sometimes referred to as a photomask, may be provided by forming a layer of photoresist material on another layer, exposing the photoresist material to a pattern of light, and developing the exposed photoresist material. An etching process, such as a reactive ion etch (RIE), may be used to form patterns (e.g., openings) by removing portions of another layer. After etching, the mask layer may be removed using a conventional plasma ashing or stripping process. Accordingly, the pattern of the mask layer facilitates the removal of another layer, such as an amorphous SiO2 layer and/or a conductive oxide diffusion barrier, for example, in areas where the mask layer has not been deposited.

For the sake of brevity, conventional techniques related to semiconductor structure and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor structures and semiconductor-based ICs are well known and so, in the interest of brevity, many conventional steps will only be mentioned briefly herein or will be omitted entirely without providing the well-known process details.

Improvements in the design of integrated circuits (IC) have enabled feature sizes for transistors in a device layer to enter into deep submicron and nanometer regime. Embodiments herein recognize benefits from further decreasing the distance between devices in the device layer, and that typically such a decrease would potentially include shorting between the devices. Specifically, if multiple vias are positioned near each other, the danger of shorting due to misalignment is increased. This danger is further increased if the vias are "tall," which occurs in a stacked field-effect transistor (FET) device where the vias protrude from the top surface (i.e., connecting to the back-end-of-line (BEOL)) to bottom source/drains (S/Ds). Described below, therefore, are embodiments of device layers in a semiconductor structure that include a double via that is divided by a dividing cut that insulates the two divided halves of the double from each other, but allows the halves to contact back side contacts to power the S/Ds. The dividing cut may be fabricated in a number of different ways, some of which are described in detail below. This flexibility in the method of fabrication provides benefits when incorporating the double via and dividing cut into an integrated circuit (IC) design.

Certain embodiments of the present invention, therefore, may include semiconductor structures with a device layer having a first top source/drain (S/D), a second top S/D, a first bottom S/D, and a second bottom S/D. This stacked configuration of S/Ds increases density and efficiency of the semiconductor structure. The semiconductor structure may further include a first direct back side contact connected to the first bottom S/D, a second direct back side contact connected to the second bottom S/D, and a double via. The double via may include a first half connecting a front side of the device layer to the first direct back side contact, and a second half connecting the front side to the second direct back side contact. The first and second halves of the double via enable the direct back side contacts to electrically couple/communicate with the frontside of the semiconductor structure. This communication is vital to some designs in which signal processing is done through front side communication interconnects. The double via may also include a dividing cut splitting the first half of the double via from the second half of the double via. The dividing cut enables the first half and the second half to be located close to each other without shorting. The close proximity of the first half and the second half reduces the overall size of the semiconductor structure, which makes the semiconductor structure smaller, or allows more devices to be included on the semiconductor structure.

Certain embodiments of the semiconductor structure may include a dividing cut with a taper from the front side to a back side, a taper from a back side to the front side, or a combination of sections tapered 1) from the front side and 2) from a back side. The taper indicates a direction of etch for how the dividing cut was formed, and the taper provides the technical benefit of separating the first half from the second half in a way that is tailored specifically to the needs of the design for the semiconductor structure. Certain embodiments of the semiconductor structure may also use the dividing cut to split the first direct back side contact from the second direct back side contact. This provides the technical benefit of reduced patterning for the direct back side contact, since the first direct back side contact and second direct back side contact may be formed as one structure that is subsequently split by the dividing cut.

In certain embodiments of the semiconductor structure, the first half directly contacts the first S/D. This provides the technical benefit of increased surface area between the S/D and the contacts. Increased surface area means reduced resistance and thus a higher efficiency for signals traveling from the S/D to other components of the semiconductor structure.

In certain embodiments of the semiconductor structure, the dividing cut may include a self-aligned dividing cut. The self-aligned dividing cut may be etched by taking advantage of a seam in the double via that is formed during deposition of the double via. A self-aligned dividing cut provides the technical benefit of accurate sizing of the first half and the second half. That is, a self-aligned dividing cut is more likely to divide the double via into equal-sized first half and second half so that signals from the first S/D and second S/D will both travel with a low resistance.

Certain embodiments of the present invention may include a method of fabricating a semiconductor structure. The method may include forming a first top source/drain (S/D), a second top S/D, a first bottom S/D, and a second bottom S/D in a stacked transistor architecture. This stacked transistor architecture of S/Ds increases density and efficiency of the semiconductor structure. The method may further include forming a double via between the first top S/D and the second top S/D, and between the first bottom S/D and the second bottom S/D, and forming a dividing cut to split the double via into i) a first half electrically connected between the first bottom S/D and a front side of the semiconductor structure and ii) a second half electrically connected between the second bottom S/D and the front side. The first and second halves of the double via enable the direct back side contacts to electrically couple/communicate with the frontside of the semiconductor structure. This communication is vital to some designs in which signal processing is done through front side communication interconnects. The dividing cut enables the first half and the second half to be located close to each other without shorting. The close proximity of the first half and the second half reduces the overall size of the semiconductor structure, which makes the semiconductor structure smaller, or allows more devices to be included on the semiconductor structure.

In certain embodiments of the method the dividing cut is formed from the front side of the semiconductor structure, the backside of the semiconductor structure, or from both sides of the semiconductor structure. The taper indicates a direction of etch for how the dividing cut was formed, and the taper provides the technical benefit of separating the first half from the second half in a way that is tailored specifically to the needs of the design for the semiconductor structure. Certain embodiments of the method may also include forming a direct back side contact, and splitting the first direct back side contact from the second direct back side contact with the dividing cut. This provides the technical benefit of reduced patterning for the direct back side contact, since the first direct back side contact and second direct back side contact may be formed as one structure that is subsequently split by the dividing cut.

In certain embodiments of the present invention, forming the double via may include etching an interlayer dielectric from the first bottom S/D and depositing the double via directly onto the first bottom S/D. Depositing the double via directly to the S/D enables a signal from the S/D to travel directly into the double via, which increases the surface area, which means reduced resistance and thus a higher efficiency for signals traveling from the S/D to other components of the semiconductor structure.

Certain embodiments of the present invention may include a semiconductor structure with a double via. The double via may include a first half electrically connected between a front side of a device layer and a first bottom source/drain (S/D) in a stacked transistor architecture and a second half electrically connected between the front side and a second bottom S/D in the stacked transistor architecture. The first and second halves of the double via enable the direct back side contacts to electrically couple/communicate with the frontside of the semiconductor structure. This communication is vital to some designs in which signal processing is done through front side communication interconnects.

The present invention and an example fabrication process will now be described in detail with reference to the Figures.

FIG. 1 depicts a cross-sectional top view of a semiconductor structure 100, in accordance with one embodiment of the present invention. The semiconductor structure 100 includes rows 102 of stacked field-effect transistor (FET) devices 104 and columns 106 of gate and source/drains (S/Ds) fabricated in a device layer 108 of the semiconductor structure 100. The columns 106 include gates 110 that control channels between bottom S/Ds 112. The semiconductor structure 100 includes a double via 114 to electrically connect bottom source/drains (S/Ds) 112 to a back-end-of-line (BEOL) interconnect network on a front side (illustrated in subsequent figures below) above the device layer 108 of the semiconductor structure 100. The double via 114 is split into a first half 116*a* and a second half 116*b*. A dividing cut 120 splits the first half 116*a* of the double via 114 from the second half 116*b* of the double via 114. Splitting the first half 116*a* from the second half 116*b* using the dividing cut 120, rather than lithographic placement of single vias, enables the devices 104 to be fabricated closer together, as clarified in detail in the subsequent description below. The semiconductor structure 100 includes other components (e.g., shallow trench isolation, interlayer dielectric) that are not illustrated in FIG. 1 so that the rows 102 and columns 106 of the semiconductor structure 100 may be more easily described.

FIG. 2 depicts a cross-sectional side view of the semiconductor structure 100 of FIG. 1 along line A-A', in accordance with one embodiment of the present invention. The semiconductor structure 100 includes the bottom S/Ds 112, and also top S/Ds 124 within an interlayer dielectric (ILD) 122 as part of a stacked device architecture within the device layer 108. A stacked transistor architecture allows multiple layers of the FET devices 104 to be vertically integrated on a single chip. The vertical integration increases the device density, or the number of devices per unit area, in the semiconductor structure 100. Device density is an important factor that affects the performance, power consumption, and cost of semiconductor devices. One of the main challenges of stacking the FET devices 104 is ensuring reliable electrical connections i) between the bottom FET devices 104 (bottom S/Ds 112) and a back-end-of-line (BEOL) fabricated on a front side 126; and ii) between the top FET devices 104 (top S/Ds 124) and the front side 126.

Various methods have been developed to overcome the challenges of connecting deep S/Ds to the front side 126, such as through-silicon vias (TSVs), microbumps, and monolithic integration. These methods enable the fabrication of three-dimensional (3D) integrated circuits (ICs) that can achieve higher functionality, lower power consumption, and smaller footprint than conventional two-dimensional (2D) ICs. As mentioned above, TSVs have some drawbacks that can increase in prevalence when the TSVs are closer together. One specific drawback results from the TSV not being perfectly vertical. That is, the directional etch techniques that are used to etch away the ILD 122 to make the hole for the TSV can take more material from the top of the hole than the bottom. More material removed from the top of the TSV hole creates a taper that narrows in the direction that the hole is created. The taper means that the width at the top is greater than the width at the bottom. The difference is width is more pronounced when the hole/via is longer, such as when the TSV is connected to the bottom S/Ds 112 in the stacked transistor architecture of the semiconductor structure 100 here in FIG. 2.

The semiconductor structure 100 here, therefore, includes the double via 114 that has been split in half by the dividing cut 120. The first half **116*a* of the double via 114 is connected to a first direct back side contact 128*a* that is connected to the first bottom S/D 112*a*, and the second half 116*b* is connected to a second direct back side contact 128*b* that is connected to the second bottom S/D 112*b*. The top S/Ds 124 are also connected to the front side 126 through top contacts 130. Connection to the front side 126 enables external control and communication with the device layer 108 and the FET devices 104** fabricated therein.

Figures 3A, 3B, 3C, 3D:
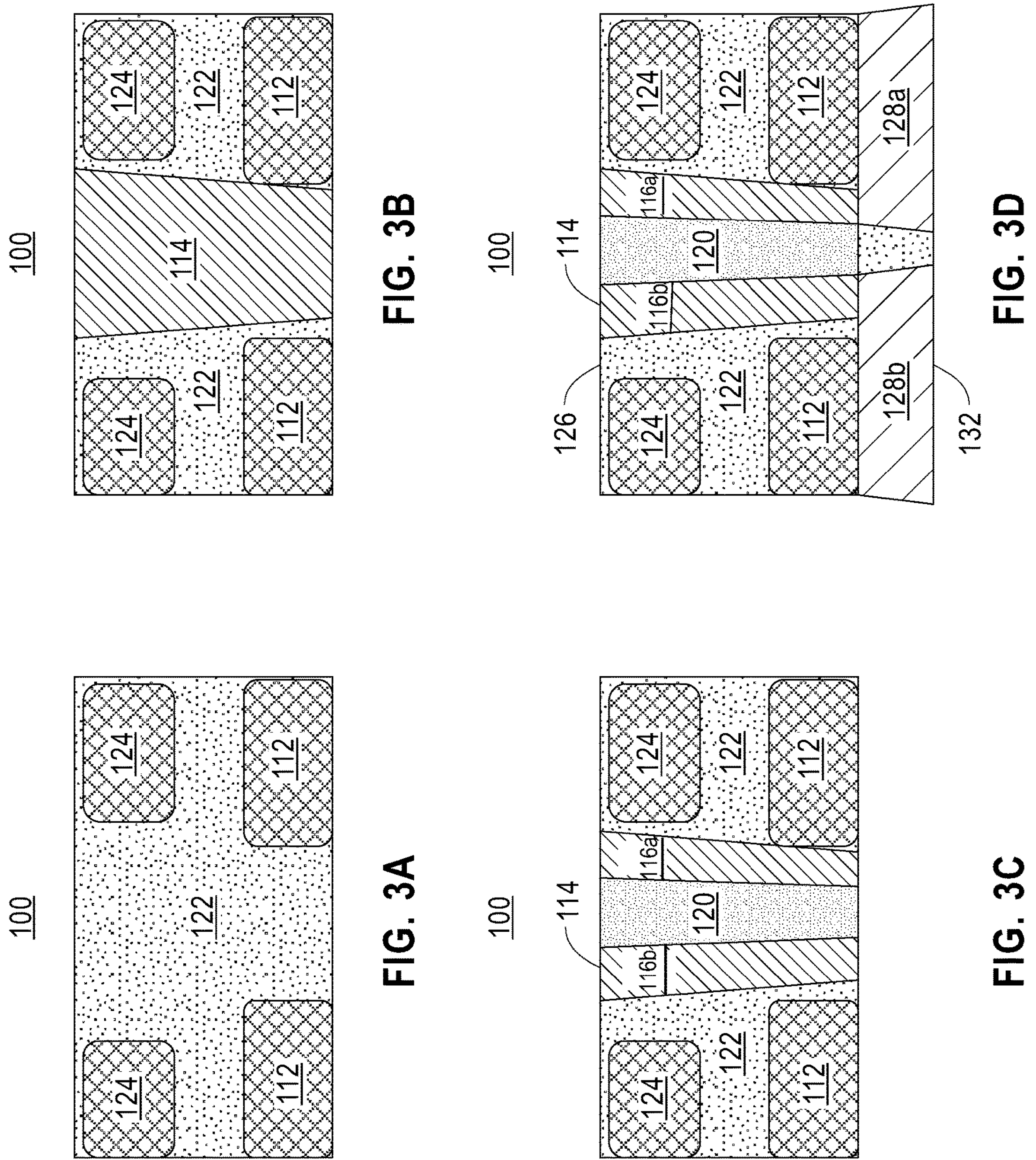
FIGS. 3A, 3B, 3C, and 3D depict cross-sectional side views of the semiconductor structure 100 of FIG. 1 at four stages of fabrication, in accordance with one embodiment of the present invention.

FIGS. 3A, 3B, 3C, and 3D depict cross-sectional side views of the semiconductor structure 100 of FIG. 1 at four stages of fabrication, in accordance with one embodiment of the present invention. FIG. 3A depicts the bottom S/Ds 112 and the top S/Ds 124 fabricated within the ILD 122. The S/Ds 112, 124 may be epitaxially grown for example on nanosheet channels in the gate region of the semiconductor structure 100. Epitaxial growth creates highly doped regions that are aligned with the channel and the gate. Epitaxial growth means that the S/Ds 112, 124 have the same crystal structure and orientation as the substrate, which reduces defects and improves electrical performance. After the epitaxially growth, the ILD 122 is deposited to isolate the S/Ds 112, 124 from each other and from the metal interconnects. The ILD 122 has to be compatible with the epitaxial regions, have a low dielectric constant, and fill the gaps between the transistors without creating voids or cracks. Therefore, choosing an appropriate ILD 122 and deposition method is also pertinent for the success of epitaxial growth techniques. In certain embodiments the bottom S/Ds 112 are formed first, followed by formation of a first layer of the ILD 122, which is then subsequently followed by the growth of the top S/Ds 124 and an additional layer of the ILD 122.

FIG. 3B depicts a fabrication stage at which the semiconductor structure 100 includes the formation of the double via 114. The double via 114 may be etched using lithographical patterning and etch processes such as extreme ultra-violet (EUV) lithography and plasma dry etch process to create a double via hole that is then filled with a conductive material, such as metal, and may also include a silicide liner, an adhesion metal liner, and/or a conductive metal fill. The semiconductor structure 100 may then be polished so that the double via 114 and the ILD 122 are flush.

FIG. 3C depicts a fabrication stage at which the semiconductor structure 100 includes the formation of the dividing cut 120. The dividing cut 120 is formed similarly to the double via 114, with lithographical patterning and etch processes. The dividing cut 120 is formed with a narrower pattern, such that the double via 114 is not replaced. Rather, the double via 114 is split into the first half **116*a* and the second half 116*b*. The dividing cut 120 is filled with a highly insulative material that prevents shorting from the first half 116*a* to the second half 116*b*. Furthermore, the dividing cut 120 includes a taper from the front side 126 to a back side 132 that reflects the direction of the etching that occurs from the front side 126**.

FIG. 3D depicts a fabrication stage at which the semiconductor structure 100 includes the formation of the first direct back side contact **128*a* and the second direct back side contact 128*b*. The first direct back side contact 128*a* and the second direct back side contact 128*b* may be fabricated after the semiconductor structure 100 has been flipped. In certain embodiments the semiconductor structure 100 may include a carrier wafer attached to the front side 126 to facilitate the flipping without damaging the device layer 108. The first direct back side contact 128*a* contacts the first bottom S/D 112*a* and provides a wide surface for signals to be conveyed between the first direct back side contact 128*a* and the first bottom S/D 112*a*. Similarly, the second direct back side contact 128*b* contacts the second bottom S/D 112*b* with a wide surface. The first direct back side contact 128*a* also contacts the first half 116*a*, and the second direct back side contact 128*b* contacts the second half 116*b*. A portion of ILD 122 is formed between the first direct back side contact 128*a* and the second direct back side contact 128*b* so that shorting is prevented between the direct back side contacts 128*a, b* as well. Both bottom devices 104, therefore, are fully electrically connected to the front side 126 of the semiconductor structure 100** with a reduced danger of shorting between vias.

Figures 4A, 4B, 4C, 4D:
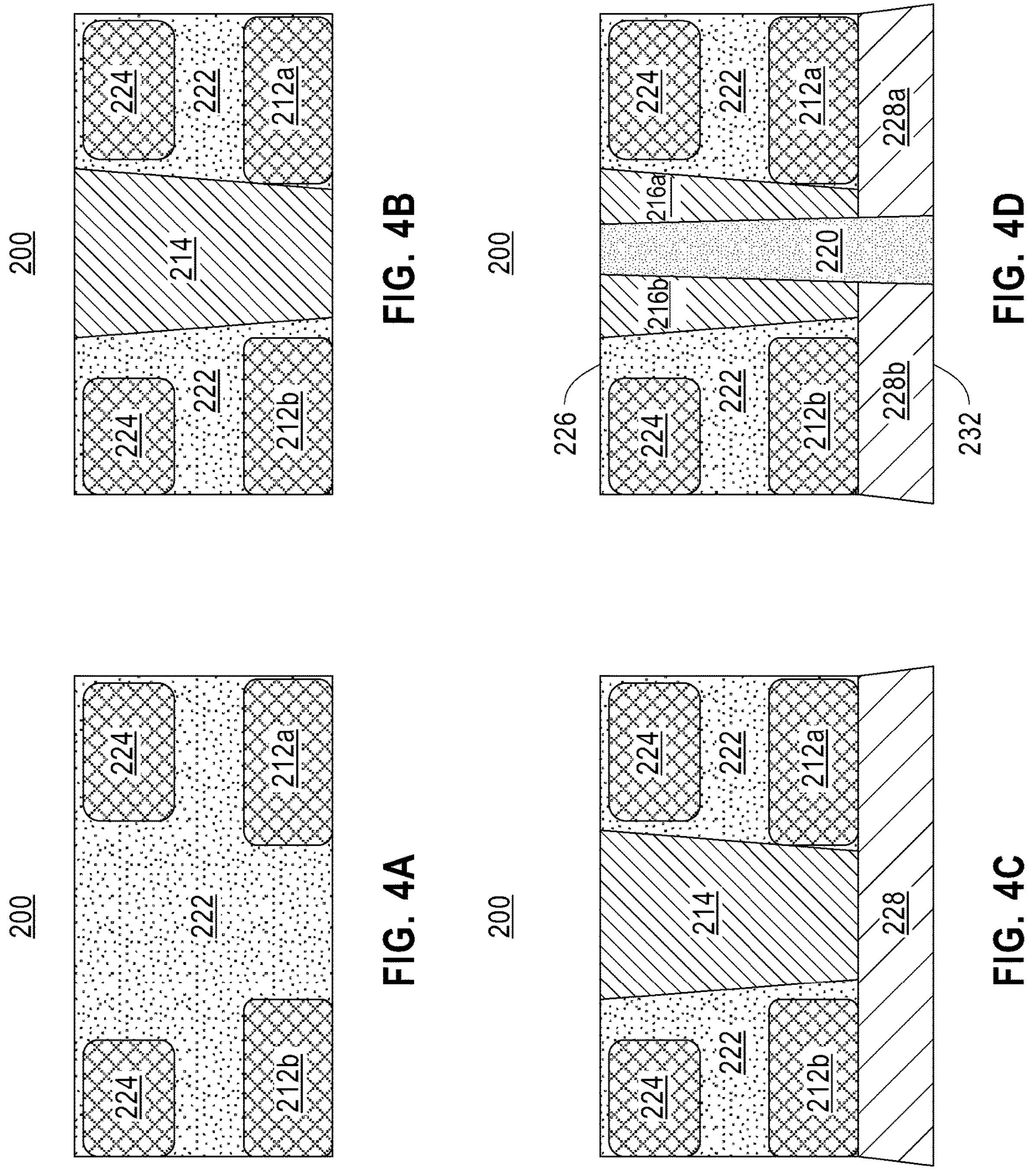
FIGS. 4A, 4B, 4C, and 4D depict cross-sectional side views of a semiconductor structure at four stages of fabrication, in accordance with one embodiment of the present invention.

FIGS. 4A, 4B, 4C, and 4D depict cross-sectional side views of a semiconductor structure 200 at four stages of fabrication, in accordance with one embodiment of the present invention. FIG. 4A depicts bottom S/Ds 212 and the top S/Ds 224 fabricated within an ILD 222. As with the first embodiment of the semiconductor structure 100 above, the S/Ds 212, 224 may be epitaxially grown on nanosheet channels in the gate region of the semiconductor structure 200. After the epitaxially growth, the ILD 222 is deposited to isolate the S/Ds 212, 224 from each other and from the metal interconnects.

FIG. 4B depicts a fabrication stage at which the semiconductor structure 200 includes the formation of a double via 214 similar to the double via 114 described above. The double via 214 may be etched using lithographical patterning and etch processes such as extreme ultra-violet (EUV) lithography and plasma dry etch process to create a double via hole that is then filled with a conductive material, such as metal, and may also include a silicide liner, an adhesion metal liner, and/or a conductive metal fill. The locations of the bottom S/Ds 212 may be customized to particular designs within the semiconductor structure 200. For example, the first bottom S/D 212*a* and the double via 214 may be formed to touch, such that the electrical signal may travel directly to the double via 214 in addition to any other contacts that are formed adjacent to the bottom S/D 212*a*.

FIG. 4C depicts a fabrication stage at which the semiconductor structure 200 includes the formation of a direct back side contact 228. In this embodiment, the direct back side contact 228 does not include separate first and second contacts. The entire direct back side contact 228 is fabricated to contact both of the bottom S/Ds 212*a, b*. The direct back side contact 228 may be fabricated after the semiconductor structure 200 is flipped, so that the front side 226 is on the bottom and normal lithographic patterning can be used to mask and deposit the direct back side contact 228.

FIG. 4D depicts a fabrication stage at which the semiconductor structure 200 includes the formation of a dividing cut 220 that splits the double via 214 and splits the first direct back side contact 228*a* from the second direct back side contact 228*b*. The double via 214 therefore includes a first half 216*a* contacting the first bottom S/D 212*a* and the now-split first direct back side contact 228*a*; and the double via 214 includes a second half 216*b* that contacts the second direct back side contact 128*b*. Certain embodiments may also have a second half 216*b* that contacts the second bottom S/D 212*b*. The dividing cut 220 includes a taper that reflects the direction of the etch. That is, the dividing cut 220 includes a taper from a back side 232 to the front side 226.

Figure 5:
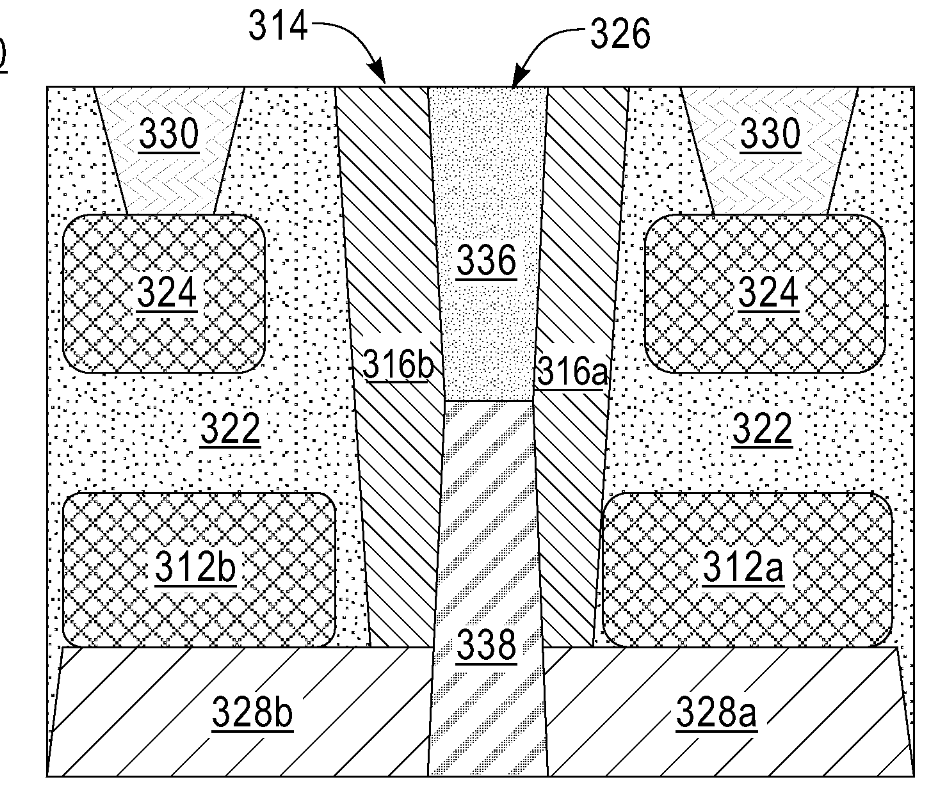
FIG. 5 depicts a cross-sectional side view of a semiconductor structure, in accordance with one embodiment of the present invention.

FIG. 5 depicts a cross-sectional side view of a semiconductor structure 300, in accordance with one embodiment of the present invention. The semiconductor structure 300 includes bottom S/Ds 312*a, b* and top S/Ds 324 fabricated as a stacked FET architecture. The top S/Ds 324 are connected to a front side 326 by top contacts 330, ad the bottom S/Ds 312*a, b* are connected to the front side 326 by a double via 314 that has been split. The double via 314 in this embodiment is split by a dividing cut 320 that includes a top section 336 and a bottom section 338. The top section 336 is fabricated by etching from the front side 326 and includes a taper that narrows away from the front side 326. The bottom section 338 is fabricated by etching from the back side 332 and includes a taper that narrows away from the back side 332. In this manner, the double via 314 is split into a first half 316*a* that connects the first bottom S/D 312*a* to the front side 326 and into a second half 316*b* that connects the second bottom S/D 312*b* to the front side 326. The semiconductor structure 300 also includes a direct backside contact that is split by the bottom dividing cut 320*b* into a first direct backside contact 328*a* and a second direct backside contact 328*b*. The first direct backside contact 328*a*, the second direct backside contact 328*b*, and the bottom dividing cut 320*b* may be fabricated after flipping the semiconductor structure 300.

Figure 6:
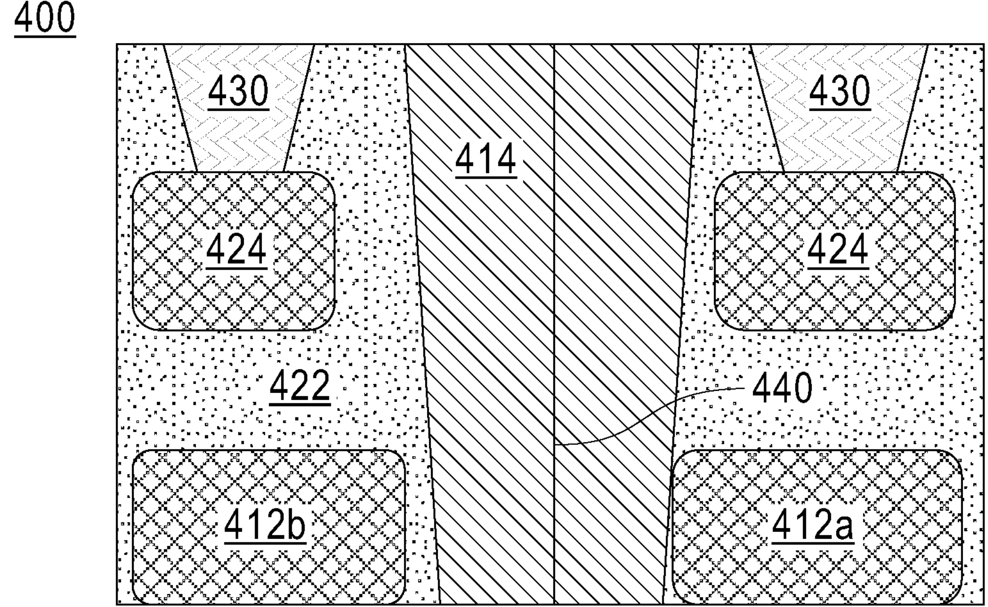
FIG. 6 depicts a cross-sectional side view of a semiconductor structure, in accordance with one embodiment of the present invention.

FIG. 6 depicts a cross-sectional side view of a semiconductor structure 400, in accordance with one embodiment of the present invention. The semiconductor structure 400 includes a seam 440 that may be formed during the fabrication of a double via 414. The seam 440 forms from the deposition of the double via 414 on each side wall, such that the seam 440 includes distinct material properties that enable a type of self-alignment when a dividing cut is added to split the double via 414.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections and buried interconnections). In any case, the chip may be integrated with other chips, discrete circuit elements, and/or other signal processing devices as part of either an intermediate product or an end product.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:

a device layer comprising a first top source/drain (S/D), a second top S/D, a first bottom S/D, and a second bottom S/D;

a first direct back side contact connected to the first bottom S/D;

a second direct back side contact connected to the second bottom S/D;

a double via comprising:

a first half connecting a front side of the device layer to the first direct back side contact; and a second half connecting the front side to the second direct back side contact; and a dividing cut splitting the first half of the double via from the second half of the double via.

2. The semiconductor structure of claim 1, wherein the dividing cut comprises a taper from the front side to a back side.

3. The semiconductor structure of claim 1, wherein the dividing cut comprises a taper from a back side to the front side.

4. The semiconductor structure of claim 1, wherein the dividing cut splits the first direct back side contact from the second direct back side contact.

5. The semiconductor structure of claim 1, wherein the first half directly contacts the first S/D.

6. The semiconductor structure of claim 1, wherein the dividing cut comprises a first section tapered from the front side and a second section tapered from a back side.

7. The semiconductor structure of claim 1, wherein the dividing cut comprises a self-aligned dividing cut.

8. A method of fabricating a semiconductor structure, comprising:

forming a first top source/drain (S/D), a second top S/D, a first bottom S/D, and a second bottom S/D in a stacked transistor architecture;

forming a double via between the first top S/D and the second top S/D, and between the first bottom S/D and the second bottom S/D;

forming a dividing cut to split the double via into i) a first half electrically connected between the first bottom S/D and a front side of the semiconductor structure and ii) a second half electrically connected between the second bottom S/D and the front side.

9. The method of claim 8, wherein the dividing cut is formed from the front side.

10. The method of claim 8, wherein the dividing cut is formed from a back side.

11. The method of claim 8, further comprising:

forming a direct back side contact; and splitting the first direct back side contact from the second direct back side contact with the dividing cut.

12. The method of claim 8, wherein forming the double via comprises etching an interlayer dielectric from the first bottom S/D and depositing the double via directly onto the first bottom S/D.

13. The method of claim 8, wherein forming the dividing cut comprises forming a first section tapered from the front side and forming a second section tapered from a back side.

14. A semiconductor structure, comprising:

a double via comprising:

a first half electrically connected between a front side of a device layer and a first bottom source/drain (S/D) in a stacked transistor architecture; and a second half electrically connected between the front side and a second bottom S/D in the stacked transistor architecture, wherein the first half of the double via is split from the second half of the double via by a dividing cut.

15. The semiconductor structure of claim 14, wherein the cut comprises a taper from the front side to a back side.

16. The semiconductor structure of claim 14, wherein the dividing cut comprises a taper from a back side to the front side.

17. The semiconductor structure of claim 16, wherein the dividing cut also splits i) a first direct back side contact between the first bottom S/D and the first half from ii) a second direct back side contact between the second bottom S/D and the second half.

18. The semiconductor structure of claim 14, wherein the first half directly contacts the first S/D.

19. The semiconductor structure of claim 18, wherein the dividing cut comprises a first section tapered from the front side and a second section tapered from a back side.

20. The semiconductor structure of claim 14, wherein the dividing cut comprises a self-aligned dividing cut.

* * * * *